United States Patent
Tsai et al.

(10) Patent No.: US 8,319,347 B2
(45) Date of Patent: Nov. 27, 2012

(54) ELECTRONIC DEVICE PACKAGE AND FABRICATION METHOD THEREOF

(76) Inventors: Chia-Lun Tsai, Tainan (TW); Wen-Cheng Chien, Hsinchu (TW); Po-Han Lee, Taipei (TW); Wei-Ming Chen, Hsinchu (TW)

( * ) Notice: Subject to any disclaimer, the term of this patent is extended or adjusted under 35 U.S.C. 154(b) by 231 days.

(21) Appl. No.: 12/470,255

(22) Filed: May 21, 2009

(65) Prior Publication Data

US 2009/0289345 A1    Nov. 26, 2009

Related U.S. Application Data

(60) Provisional application No. 61/128,358, filed on May 21, 2008.

(51) Int. Cl.
*H01L 23/48* (2006.01)
*H01L 23/52* (2006.01)
*H01L 29/40* (2006.01)
*H01L 21/46* (2006.01)
*H01L 21/4763* (2006.01)

(52) U.S. Cl. ........ 257/774; 257/690; 257/692; 257/698; 257/775; 257/E23.011; 257/E23.02; 257/E23.067; 257/E23.174; 438/113; 438/458; 438/462; 438/618; 438/620; 438/637; 438/638; 438/639; 438/640

(58) Field of Classification Search .................. 257/692, 257/698, 776, E23.011, E23.067, E23.174, 257/690, 774–775, E23.02; 438/113, 458, 438/462, 620, 618, 637–640
See application file for complete search history.

(56) References Cited

U.S. PATENT DOCUMENTS

| | | | | |
|---|---|---|---|---|
| 5,122,856 A * | 6/1992 | Komiya | ......................... | 257/774 |
| 5,923,047 A * | 7/1999 | Chia et al. | ....................... | 257/48 |
| 7,375,009 B2 * | 5/2008 | Chua et al. | ..................... | 438/460 |
| 7,435,620 B2 * | 10/2008 | Benson et al. | ................ | 438/108 |
| 2002/0180027 A1 * | 12/2002 | Yamaguchi et al. | ........... | 257/700 |
| 2005/0046002 A1 * | 3/2005 | Lee et al. | ....................... | 257/678 |
| 2006/0108691 A1 * | 5/2006 | Kameyama et al. | .......... | 257/758 |
| 2007/0249095 A1 * | 10/2007 | Song et al. | ..................... | 438/113 |
| 2007/0284602 A1 * | 12/2007 | Chitnis et al. | ................... | 257/98 |
| 2008/0211113 A1 * | 9/2008 | Chua et al. | ..................... | 257/782 |
| 2008/0274603 A1 * | 11/2008 | Do et al. | ........................ | 438/462 |
| 2009/0321957 A1 * | 12/2009 | Sasaki et al. | ................... | 257/777 |

* cited by examiner

*Primary Examiner* — Cheung Lee
*Assistant Examiner* — Jeremy Joy
(74) *Attorney, Agent, or Firm* — Liu & Liu

(57) ABSTRACT

An electronic device package and a fabrication method thereof are provided. The fabrication method includes providing a semiconductor substrate containing a plurality of chips having a first surface and an opposite second surface. A plurality of conductive electrodes is disposed on the first surface and the conductive electrodes of the two adjacent chips are arranged asymmetrically along side direction of the chip. A plurality of contact holes is formed in each chip, apart from the side of the chip, to expose the conductive electrodes.

28 Claims, 11 Drawing Sheets

ELECTRONIC DEVICE PACKAGE AND FABRICATION METHOD THEREOF

CROSS REFERENCE TO RELATED APPLICATIONS

This application claims the benefit of U.S. Provisional Application No. 61/128,358, filed on May 21, 2008, the entirety of which is incorporated by reference herein.

BACKGROUND OF THE INVENTION

1. Field of the Invention

The present invention relates to an electronic device package, and in particular relates to an electronic package fabricated by a wafer level package process.

2. Description of the Related Art

Through-silicon via (TSV package process) packaging techniques have been disclosed to package advanced electronic devices. However, difficulties still exist for fabricating TSV packaged electronic devices, as mass production yields are insufficient, when trying to obtain a conductive trace layer in a via of high aspect ratio.

FIG. 1 shows a partial plane view of a conventional electronic device package 1. A plurality of conductive contact pads 14 is disposed on a peripheral area 11 of a chip active area 10. A conventional TSV packaging process forms a corresponding via 12 at the position of each conductive contact pad 14. Each via 12 has a single contact hole 16 therein to expose one corresponding conductive contact pad 14.

However, the aspect ratios of via 12 are normally at least 1.6, such that subsequent filling processes for various material layers are difficult. Thus, an electronic device package and a fabrication method thereof which can overcome the fabrication problems of vias of high aspect ratios is therefore desired.

BRIEF SUMMARY OF THE INVENTION

According to an illustrative embodiment, an electronic device package is provided. The electronic device package comprises: a semiconductor substrate, containing a plurality of chips, wherein each chip has a first surface and an opposite second surface; a plurality of conductive electrodes disposed on or over the first surface of each chip, wherein the conductive electrodes on two adjacent chips are arranged asymmetrically along a side direction of the chip; and a plurality of contact holes formed in each chip to expose the conductive electrodes.

According to another illustrative embodiment, a method for fabricating an electronic device package is provided. The method comprises: providing a semiconductor substrate, containing a plurality of chips, between the two adjacent chips including a scribe line, wherein each chip has a first surface and an opposite second surface; providing a plurality of conductive electrodes on or over the first surface of each chip, wherein the conductive electrodes on two adjacent chips are arranged asymmetrically along a side direction of the chip; and forming a plurality of contact holes in each chip to expose the conductive electrodes.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The embodiments of electronic device packages of the invention and fabrication methods thereof are illustrated by embodiments of fabricating image sensor device packages in the following description. However, it should be appreciated that the invention may also be applied to forming other semiconductor devices. Therefore, the packages of the embodiments of the invention may be applied to active or passive devices, or electronic components with digital or analog circuits, such as opto electronic devices, micro electro mechanical systems (MEMS), micro fluidic systems, physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads.

The wafer scale package process mentioned above mainly means that after the package process is accomplished during the wafer stage, the wafer with chips is cut to obtain separate independent packages. However, in an embodiment of the invention, separate independent chips may be redistributed overlying a supporting wafer and then be packaged, which may also be referred to as a wafer level chip scale package (WLCSP) process. In addition, the above mentioned wafer scale package process may also be adapted to form electronic device packages of multi-layered integrated circuit devices by stacking a plurality of wafers having integrated circuits.

Figure 1:
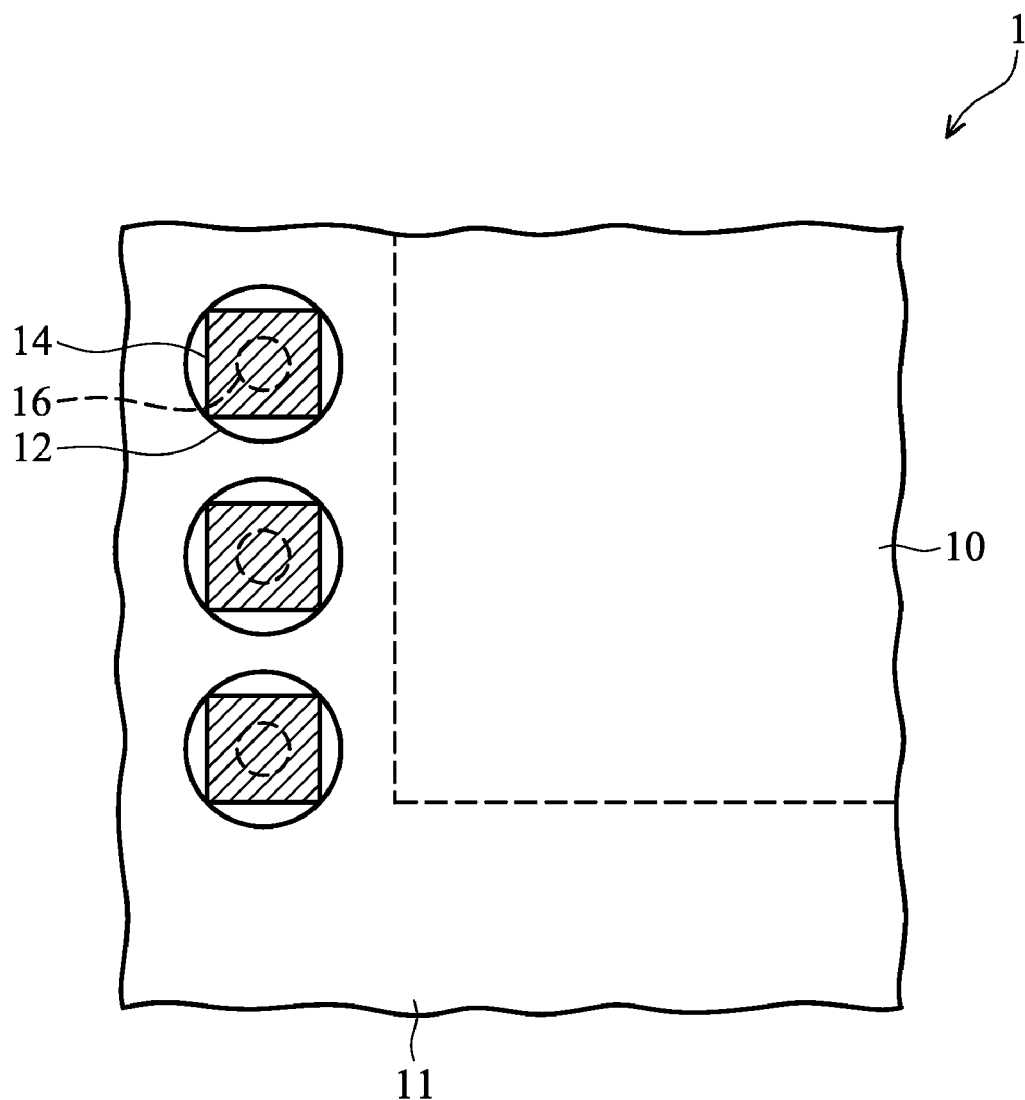
FIG. 1 shows an illustrative plane view of a portion of a conventional electronic device package.
Figure 2A:
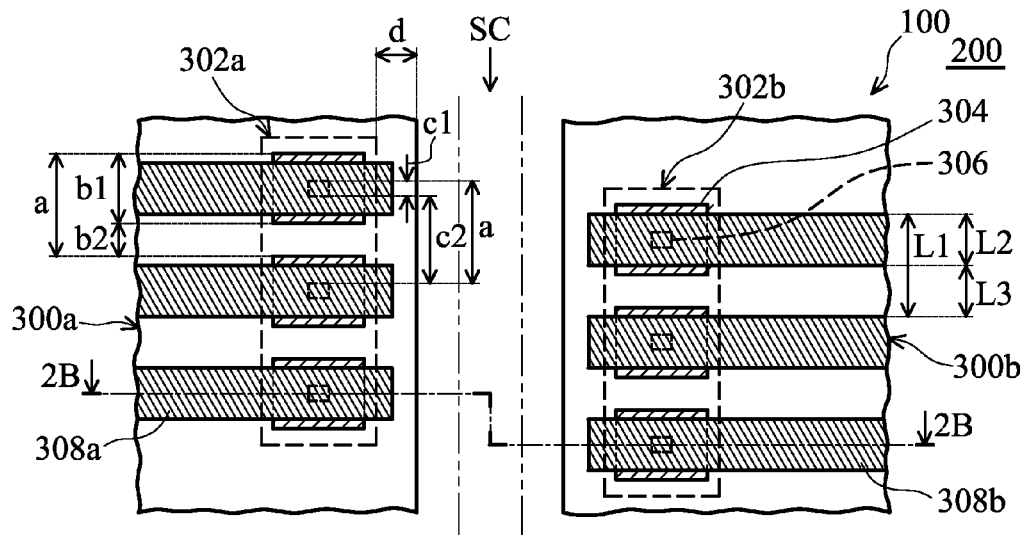
FIG. 2A shows an illustrative plane view of an electronic device package according to an embodiment of the invention.
Figure 2B:
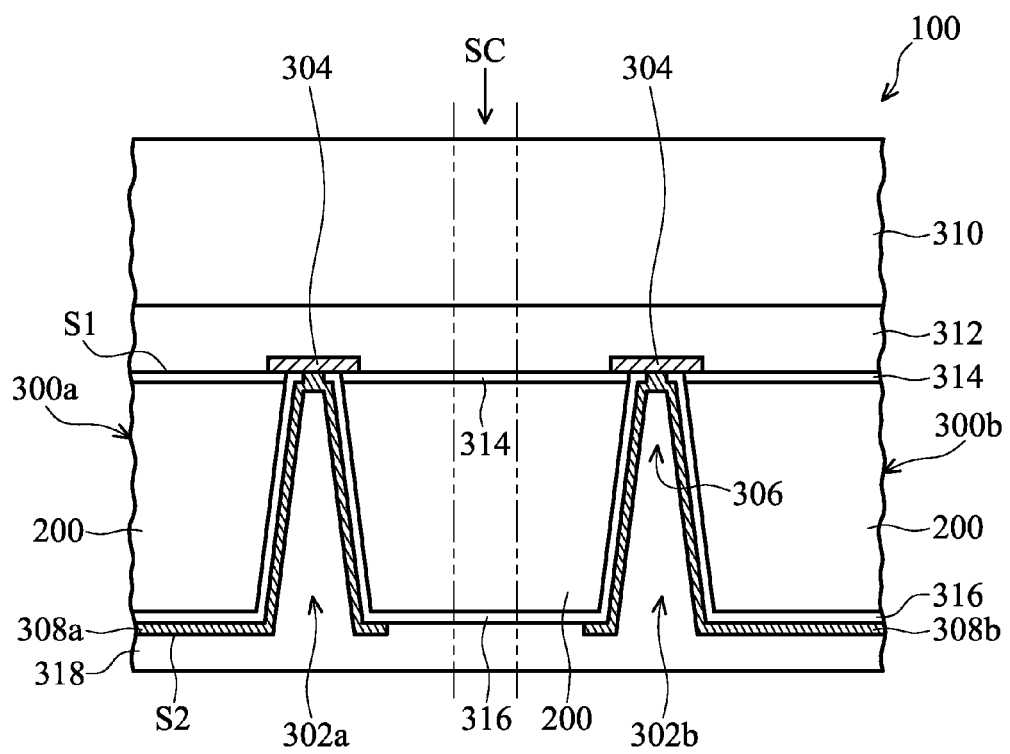
FIG. 2B shows an illustrative cross section of an electronic device package along the line 2B-2B of FIG. 2A.
Figure 4A:
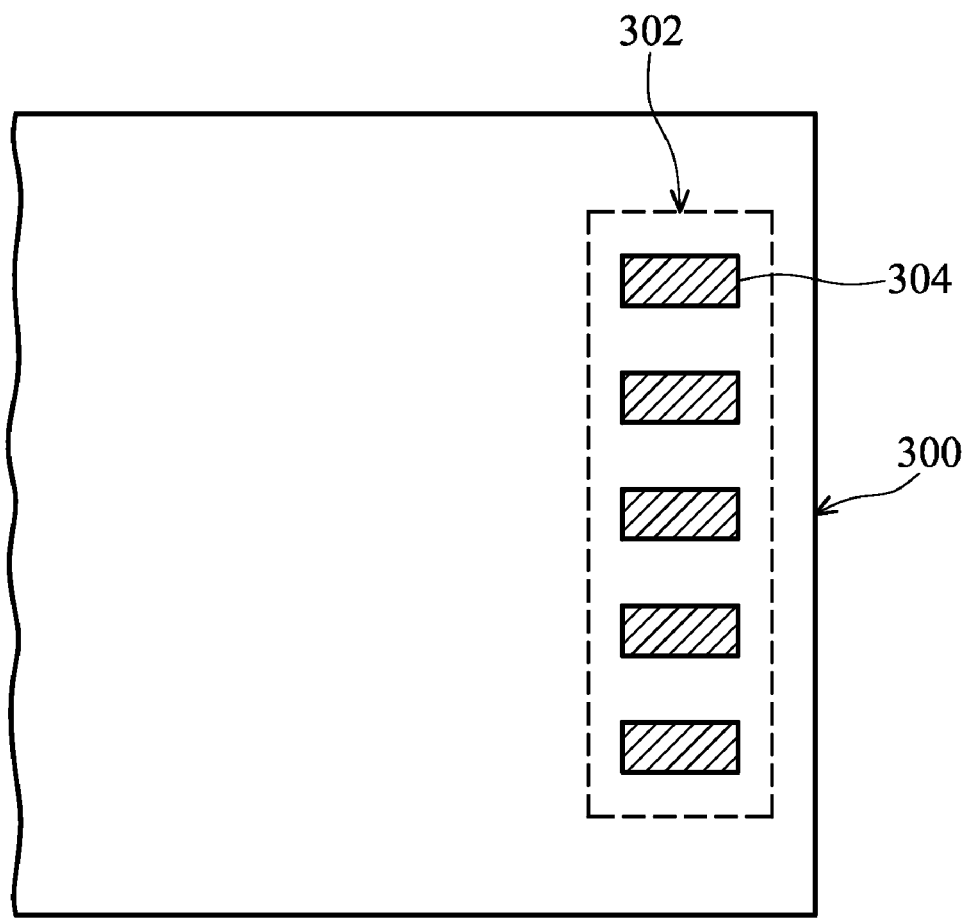
FIGS. 4A and 4B show illustrative plane views of conductive contact pad groups in trenches of an electronic device package according to embodiments of the invention.
Figure 4B:
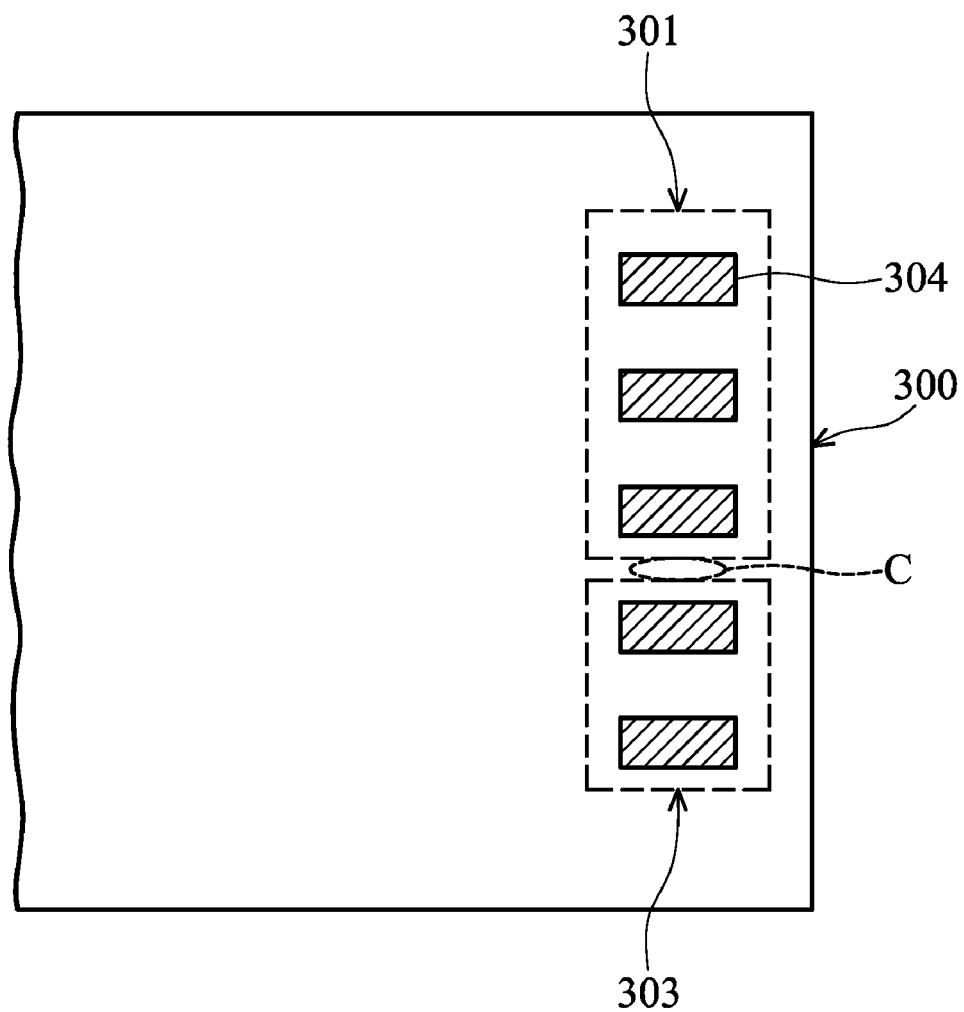

Referring to FIGS. 2A and 2B, FIG. 2A shows a plane view of a portion of an electronic device package 100 according to a wafer scale package process of an embodiment of the invention. FIG. 2B is a cross section of the electronic device package along the line 2B-2B of FIG. 2A. Note that the line 2B-2B of FIG. 2A is not a straight line. The cross section of FIG. 2B shows an electronic device package structure that is not arranged in a straight line. First, a semiconductor substrate 200 is provided. The semiconductor substrate 200 may be a wafer, containing a plurality of die areas for depositing or forming a plurality of chips. A scribe line SC is disposed between any two adjacent chips 300a and 300b. Each chip has a first surface 51 and an opposite second surface S2. A plurality of conductive electrodes 304 is disposed on the first surface 51 of each chip. An insulating layer 314, such as a silicon oxide layer, is disposed between the semiconductor substrate 200 and the conductive electrodes 304. Note that the conductive electrodes 304 on any two adjacent chips 300a and 300b are arranged asymmetrically at the left and right sides along a side direction of the chip, i.e. the direction of the scribe line SC. A recess or trench 302a and a recess or trench 302b are formed in each chip 300a and 300b respectively to expose the plurality of conductive electrodes 304. There are three conductive electrodes shown in the trench of FIG. 2A. However, it should be appreciated that two or more than three conductive electrodes may be disposed in one trench, and one or more than one trench may be formed in each chip to expose the plurality of conductive electrodes 304. As shown in FIG. 4A, one trench 302 is formed in the chip 300 to expose the plurality of conductive electrodes 304 on the same side of the chip. In addition, there are two trenches 301 and 303 formed in the chip 300 of FIG. 4B. There is an area C between the trenches. A semiconductor substrate with a height substantially equal to a depth of the trench is disposed in the area C, which can contain integrated circuits, sensor films or cavity structures. Meanwhile, compared to a chip only with one trench, the chip with a plurality of trenches can have the areas C between the trenches to strengthen the structure of the electronic device package. It should be appreciated that although there are only two trenches shown in FIG. 4B, more than two trenches can be formed in the chip to contain more than one integrated circuit, sensor film or cavity structure and to strengthen the structure of the electronic device package.

As shown in FIG. 2B, an insulating layer 316 is formed to cover the second surface S2 of each chip and sidewalls and bottoms of the trenches. A plurality of contact holes 306 is formed in the insulating layer 316 on the bottom of the trench to expose contact surfaces of corresponding conductive electrode 304. A plurality of conductive trace layers 308a and 308b is disposed on the insulating layer 316 of the chips 300a and 300b respectively. Each conductive trace layer is extended from the second surface S2 of each chip to the sidewall and the bottom of the trench, and extended to the contact surface of the conductive electrode 304 through the corresponding contact hole 306, wherein the conductive trace layers 308a and 308b formed on any two adjacent chips 300a and 300b are arranged asymmetrically at the left and right sides along the side direction of the chip.

The trenches 302a and 302b are disposed apart from the sides of the chips by a distance d. The semiconductor substrate 200 is disposed between the two adjacent chips 300a and 300b with a height substantially equal to a depth of the trench, and the semiconductor substrate 200 is also disposed between the trenches 302a and 302b. Accordingly, while the conductive trace layers 308a and 308b are being fabricated by a photolithography and etching process and the patterns of the conductive trace layers 308a and 308b are being formed by an exposure, the lights reflected by the pattern of the conductive trace layer 308a on the chip 300a is shielded by the semiconductor substrate 200 between the trenches 302a and 302b and thus not irradiated to the area between the pattern of the conductive trace layer 308b on the chip 300b, and vice versa. Specifically, the lights reflected by the pattern of the conductive trace layer 308b on the chip 300b do not irradiate the area between the patterns of the conductive trace layer 308a on the chip 300a. Thus, no residual material of the conductive trace layer is left between the conductive trace layers 308a and 308b, thus effectively avoiding shorting between the conductive trace layers.

Further, as shown in FIG. 2A, in an embodiment of the invention, two conductive electrodes 304 of the electronic device package 100 have a pitch "a" substantially equal to a pitch of the two contact holes 306, for example, the pitch "a" is about 100 μm. A width b1 of the conductive electrode 304 is about 80 μm. A distance b2 between the two conductive electrodes 304 is about 20 μm. A width c1 of the contact hole 306 is about 20 μm. A distance c2 between the two contact holes 306 is about 80 μm. An insulating distance between the two conductive trace layers on the conductive electrodes can be widened by the formation of the contact holes 306; for example, increasing the width from 20 μm to 80 μm. Therefore, shorting between the conductive trace layers can be effectively avoided. In one embodiment, a pitch L1 of the two conductive trace layers is about 100 μm, a width L2 of the conductive trace layer is about 50 μm, and a distance L3 between the two conductive trace layers is about 50 μm.

As shown in FIG. 2B, a package layer 310 or a cover plate may be further formed on the first surface S1 of the chip. Referring to FIG. 3F, in an embodiment of the invention, a spacer 312 can be disposed between the upper package layer 310 and the conductive electrodes 304 to form a cavity 326 between the upper package layer 310 and the active area of the chip, wherein the cavity 326 is surrounded by the spacer 312. In addition, a passivation layer 318 such as polyimide (PI) is used as a solder mask, which fills the trenches 302a and 302b and is extended to the second surface S2 of the chip.

Figure 2C:
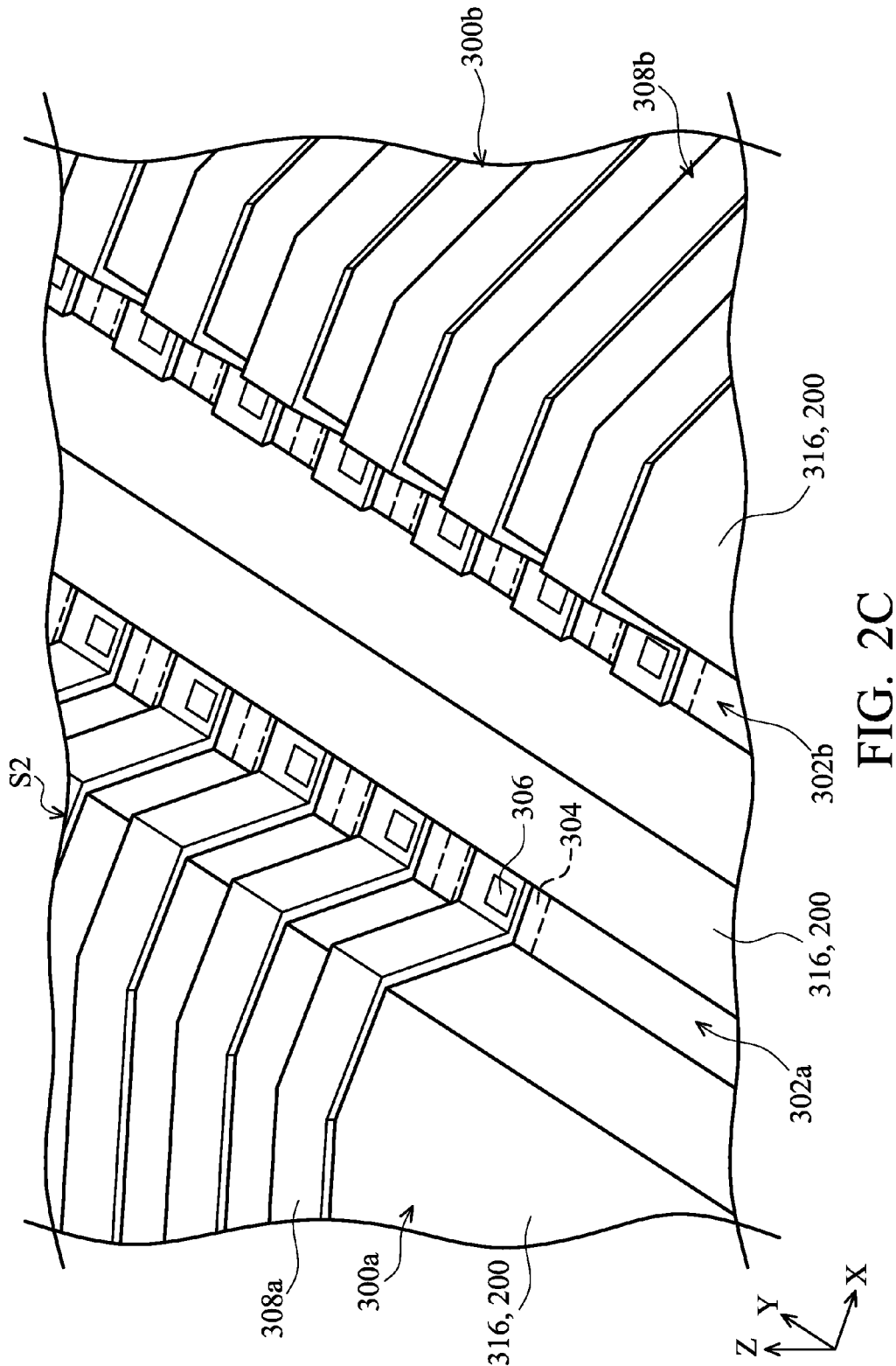
FIG. 2C shows an illustrative stereoscopic view of the electronic device package of FIG. 2A.

FIG. 2C shows a stereoscopic view of a portion of the electronic device package 100 according to the wafer scale package process of an embodiment of the invention. Note that the stereoscopic view is from the second surface S2 of the chip and the elements over the conductive trace layers 308a and 308b are not shown. As shown in FIG. 2C, the semiconductor substrate 200 is disposed between the two adjacent chips 300a and 300b and has a height substantially equal to the depths of the trenches 302a and 302b. The insulating layer 316 is formed in the trenches and to cover the semiconductor substrate 200. Because the conductive trace layers 308a and 308b are usually formed from metal materials, and a photoresist pattern of the conductive trace layer 308a is formed by an exposure process, wherein lights may be reflected by the metal material under the photoresist pattern of the conductive trace layer 308a. Thus, the reflective lights would be shielded by the semiconductor substrate 200 between the two adjacent chips and do not irradiate to an area between photoresist patterns of the conductive trace layer 308b of the other chip 300b. Therefore, no photoresist patterns between the conductive trace layers 308b are left shorting between the conductive trace layers 308b is avoided, and vice versa. The shorting between the conductive trace layers 308a are also avoided.

FIGS. 3A-3F shows cross sections of parts of the steps for fabricating an electronic device package according to an embodiment of the invention. Note that the conductive electrodes on two adjacent chips are arranged asymmetrically. In order to simultaneously show the structure of the two chips containing the conductive electrodes, FIGS. 3A-3F are cross sections along the non-straight line 2B-2B of FIG. 2A. However, it should be appreciated that the package structures of the two adjacent chips 300a and 300b in FIGS. 3A-3F are not arranged on a straight line.

Figure 3A:
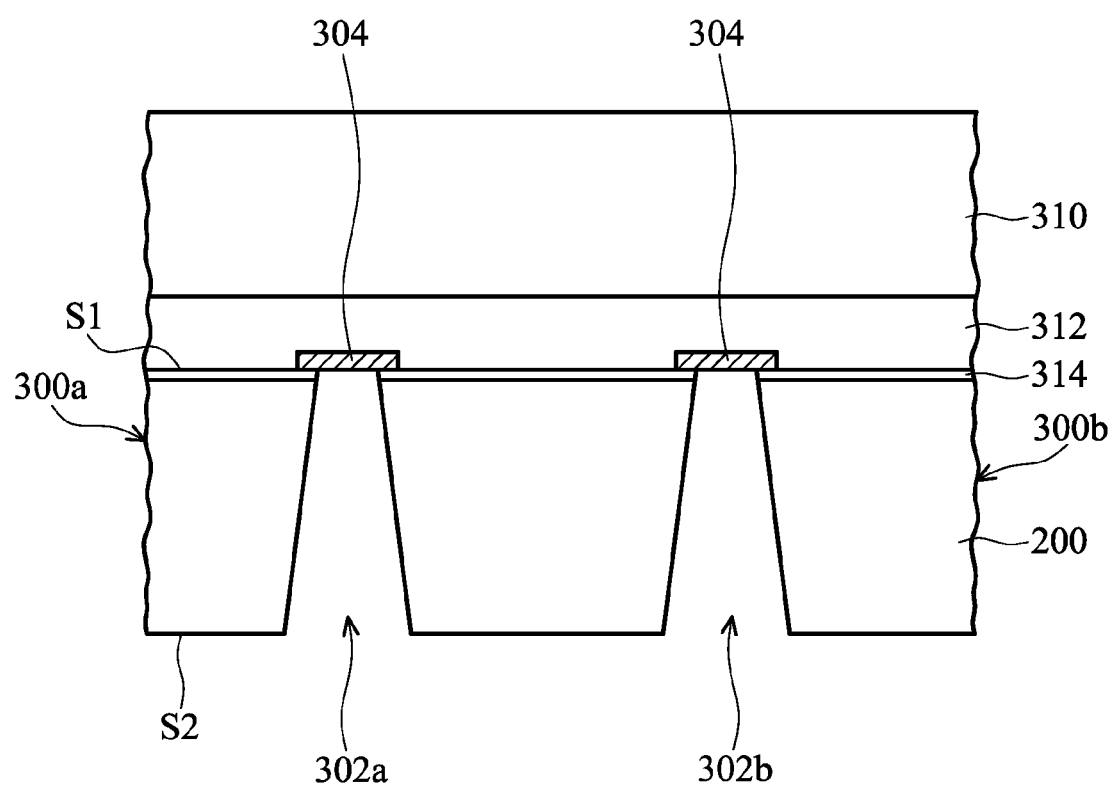
FIGS. 3A-3F are illustrative cross sections showing the steps for fabricating an electronic device package according to an embodiment of the invention.

Referring to FIG. 3A, a wafer 200 is provided first, containing a plurality of die areas to deposit or form a plurality of chips 300a and 300b. Each chip 300a or 300b has a first surface S1 and an opposite second surface S2. A plurality of conductive electrodes 304 is formed on or over the first surface S1 of each chip body 300a or 300b. An insulating layer 314 is formed between the silicon substrate 200 of the chips and the conductive electrodes 304. The insulating layer 314 may be formed from silicon oxide, silicon oxynitride or low dielectric constant materials.

The wafer 200 usually contains a plurality of chips thereon, such as image sensors. Referring to FIG. 3F, a corresponding micro lens array 324 may be disposed on the image sensor to serve as an image sensitive surface.

Next, the front surface of the wafer 200, i.e. the first surface S1 of the chips 300a and 300b is attached to a package layer 310. The package layer 310 is used as a carrier structure for the packages, which may be formed from glass, quartz, opal, plastic, or other transparent substrates to provide light remission in and out thereto and therefrom. Note that a filter and/or an anti-reflective layer may be selectively formed on the package layer. A spacer 312 may be formed between the package layer 310 and the wafer 200, such that a cavity 326 is formed between the package layer 310 and the wafer 200, as shown in FIG. 3F. The cavity 326 is surrounded by the spacer 312, and the spacer is formed from adhesive materials such as epoxy resin. In order to increase the hermetic seal of the package, an additional bonding layer may be added between the spacer 312 and the package layer 310. Generally, the spacer 312 is disposed on the conductive electrode 304.

Next, a step of thinning the wafer can be selectively performed. For example, the wafer 200 is thinned at the back surface S2 to form a wafer with a specific height as shown in FIG. 3A. The thinning process may be an etching, milling, grinding or polishing process.

Then, the trenches 302a and 302b are formed in the chips 300a and 300b respectively by, for example, an etching process to remove a portion of the silicon substrate 200, such that the trench extends along a direction from the second surface S2 to the first surface S1. At the same time, the insulating layer 314 above the conductive electrodes 304 is removed to expose the conductive electrodes, wherein an area of the bottom of the trench includes more than two conductive electrodes and the regions between the conductive electrodes. Thus, the trenches 302a and 302b can have lower aspect ratios, for example, the aspect ratio can be reduced from about 1.6 to about 0.33, which can significantly reduce complexity of subsequent processes.

Figure 3B:
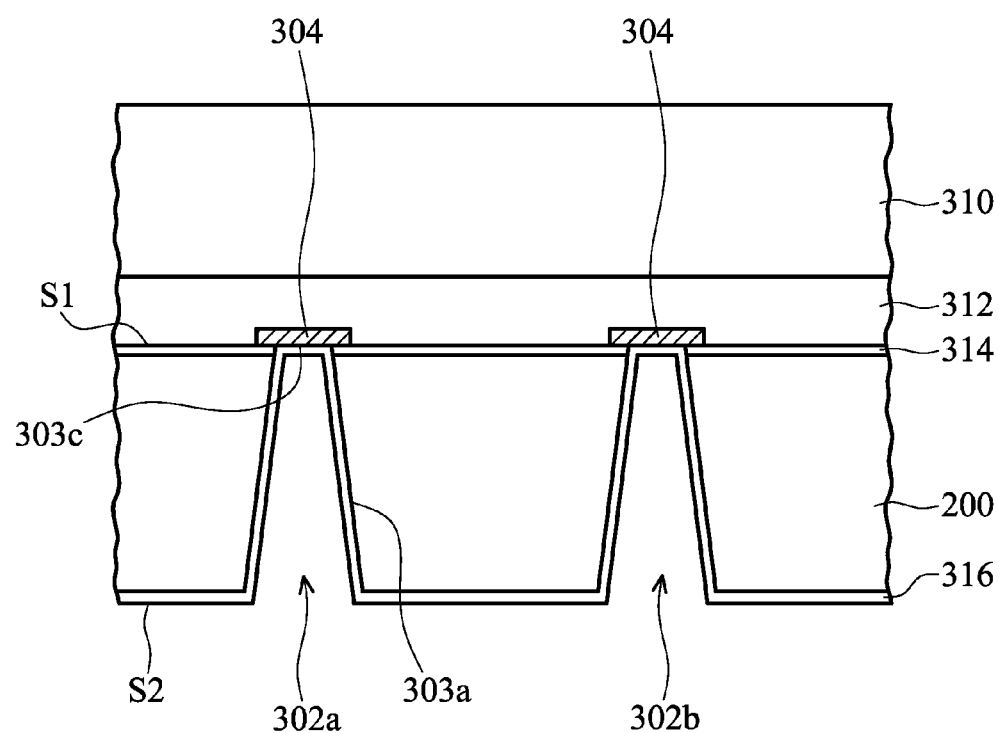

Then, referring to FIG. 3B, in order to isolate the chip bodies 300a and 300b and subsequently formed conductive trace layers, first, an insulating layer 316 can be conformally formed to cover the second surface S2 of the chips 300a and 300b and extend to a sidewall 303a and a bottom 303c of the trench. In one embodiment, the insulating layer 316 may be a photosensitive insulating material layer.

Figure 3C:
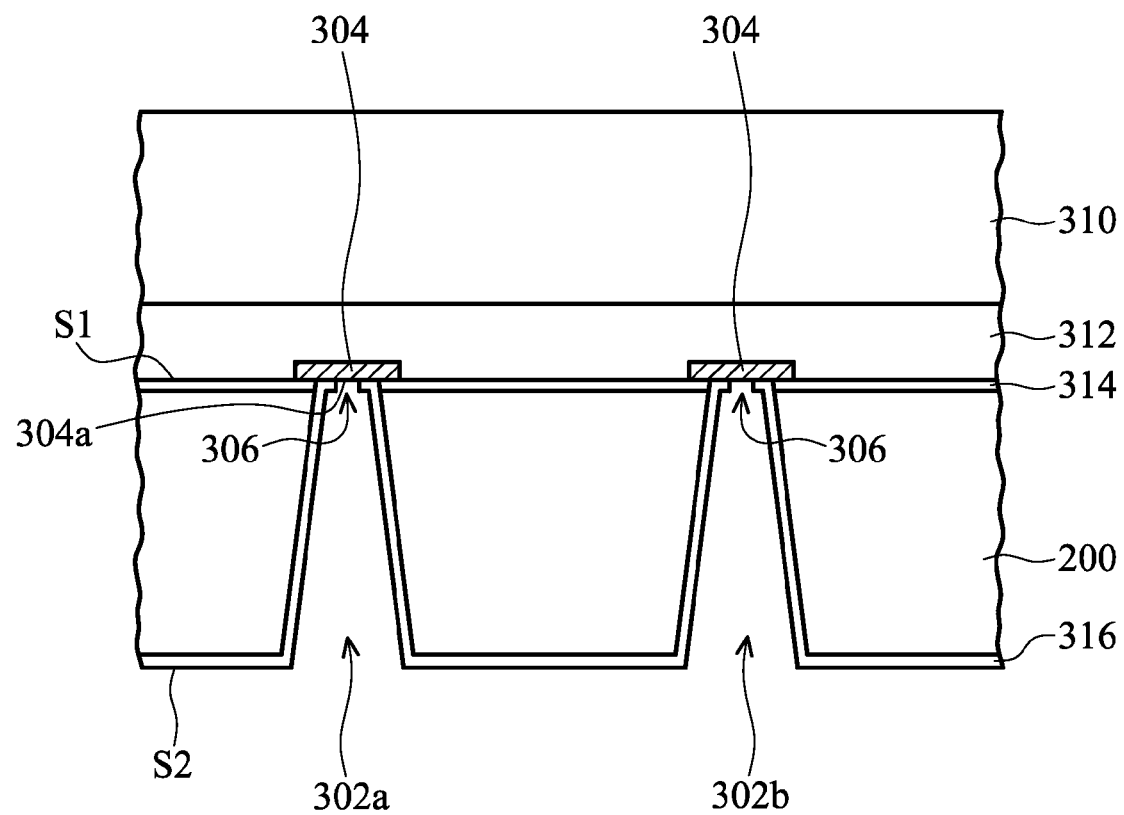

Referring to FIG. 3C, a portion of the photosensitive insulating material layer 316 is exposed. The photosensitive insulating material layer 316 at the bottom of the trench is removed by development by a developer. Then, a plurality of contact holes 306 is formed in the photosensitive insulating material layer 316 at the bottom of the trench to expose a contact surface 304a of the corresponding conductive electrode 304. In this embodiment, the photosensitive insulating material layer 316 can be selected from photosensitive organic polymer materials. The compositions of the photosensitive organic polymer materials may include, but is not limited to, a polyimide (PI), butylcyclobutene (BCB), parylene, polynaphthalenes, fluorocarbons, and accrylates material etc. The photosensitive organic polymer materials can be formed by a coating process, such as a spin coating, a spray coating, or a curtain coating process, or other suitable deposition methods. Moreover, in one embodiment, one trench can contain more than two contact holes.

For the fabrication method of the electronic device package according to one embodiment of the invention, the technical barrier for achieving high aspect ratios for conventional TSV packaged electronic devices can be overcame by using a trench group via (TGV) packaging technology to increase fabrication yields.

Figure 3D:
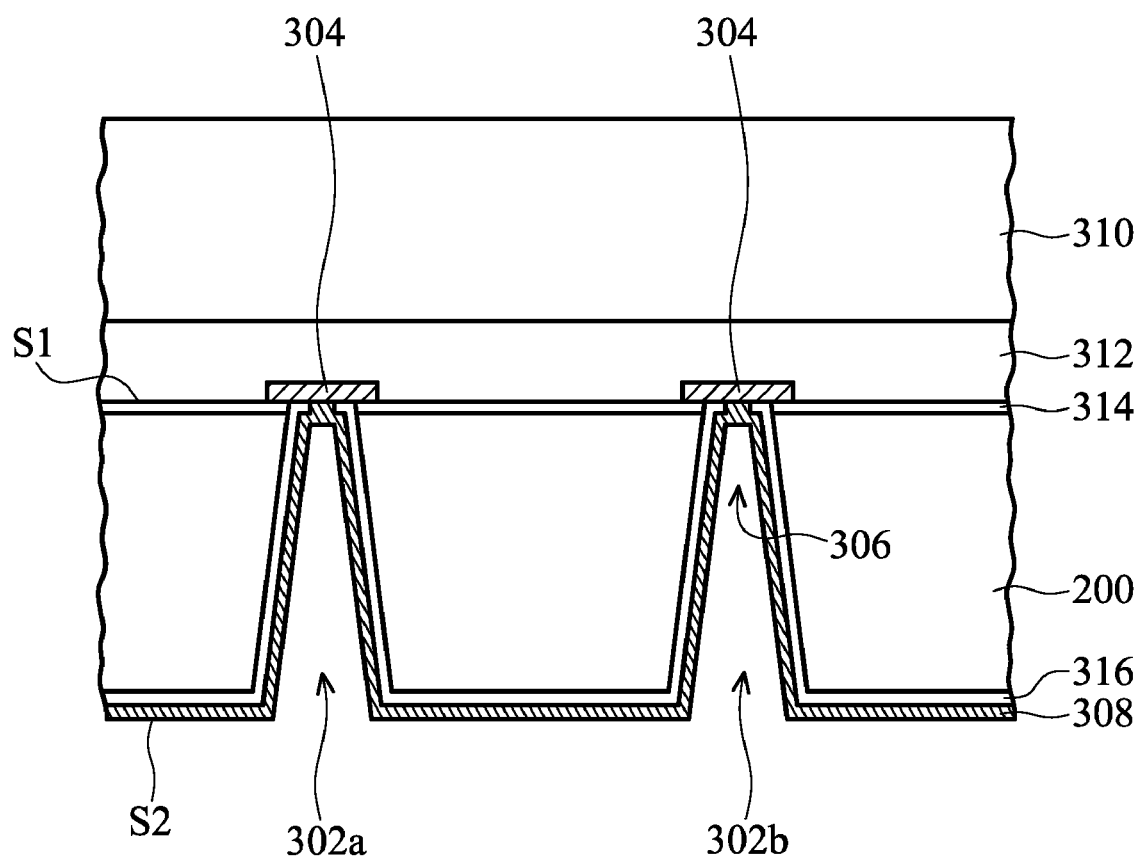

Referring to FIG. 3D, a conductive layer 308 is formed on the entire insulating layer 316. The conductive layer 308 is conformally formed on the second surfaces S2 of the chips 300a and 300b and extended to the sidewalls and the bottoms of the trenches 302a and 302b and in the contact holes 306. In one embodiment, the conductive layer, such as a copper, aluminum, silver, or nickel layer or alloys thereof, can be conformally deposited by a physical vapor deposition (PVD) or a sputtering process.

Figure 3E:
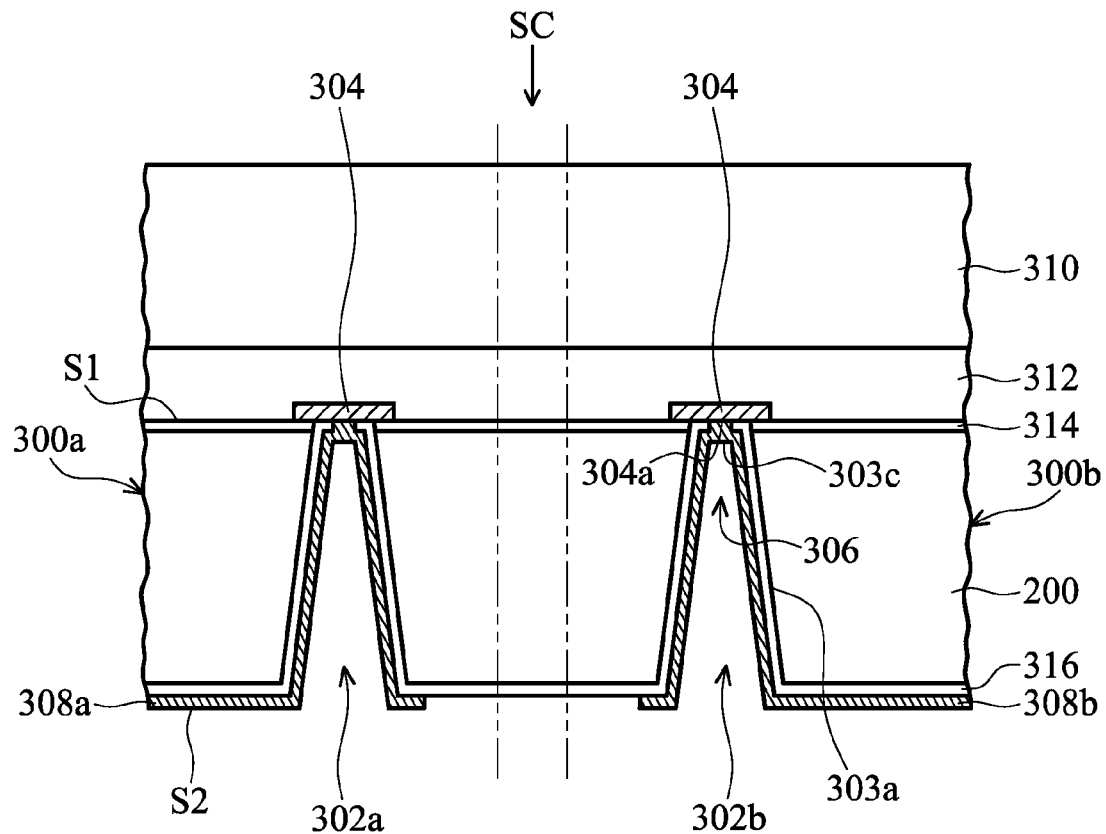
Figure 3F:
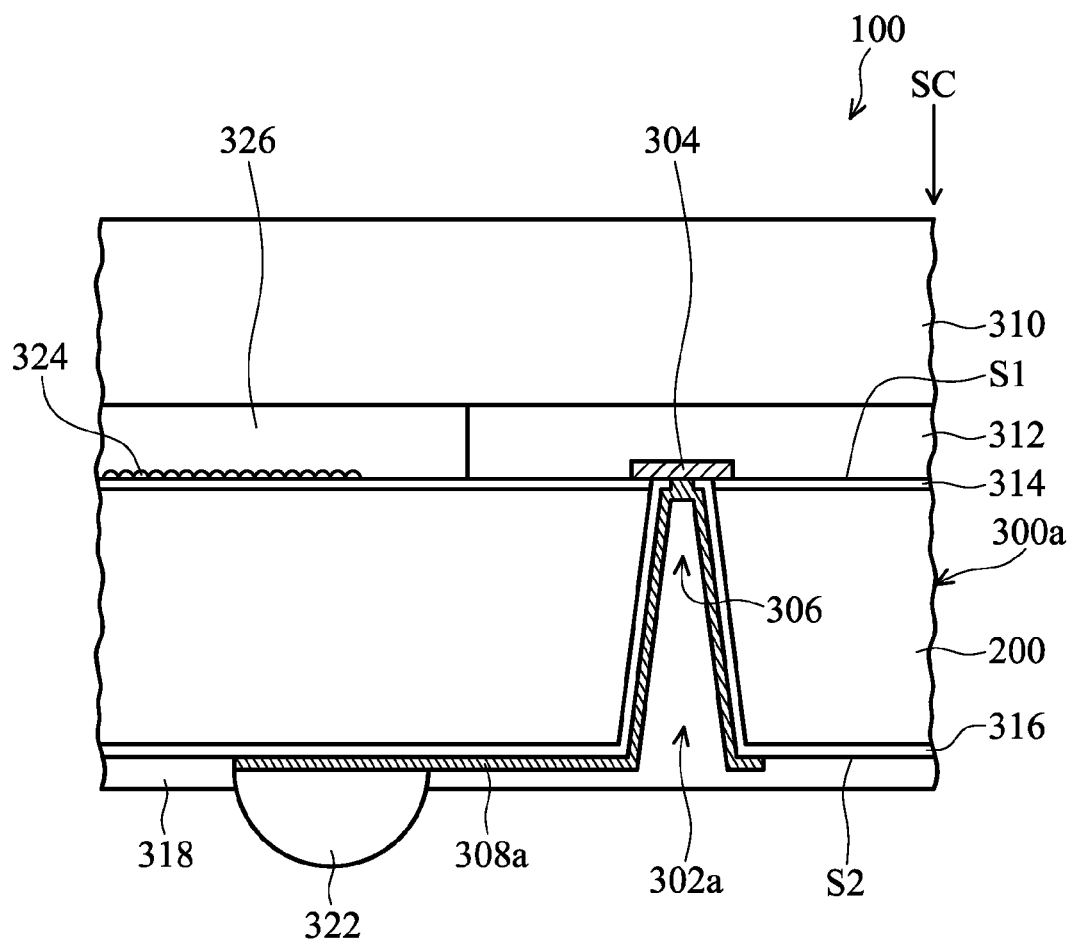

Referring to FIG. 3E, the conductive layer is patterned by a photolithography and etching process to form a plurality of conductive trace layers 308a and 308b on the chips 300a and 300b respectively. First, a photoresist layer (not shown) is entirely coated on the conductive layer. A mask with a pattern of the conductive trace layers 308a and 308b is used to perform an exposure process. In an embodiment, a portion of the mask with the pattern of the conductive trace layers 308a and 308b is pervious to light. The photoresist layer irradiated by light is left after the development process to form a photoresist pattern which is the same as the pattern of the conductive trace layers 308a and 308b. Then, the photoresist pattern is used as a mask to perform an etching process, such that the plurality of conductive trace layers 308a and 308b is formed on each chip. Each conductive trace layer 308a and 308b is extended from the insulating layer 316 on the second surface S2 of the chip to the sidewall 303a of the trench, and extended to the contact surface 304a of the conductive electrode 304 through the corresponding contact hole 306 along the bottom 303c of the trench.

In the above mentioned exposure process, because the conductive layer under the photoresist layer is a metal layer, the light from the exposure process is normally reflected by the metal layer. Specifically, if there was no semiconductor substrate with a height substantially equal to a depth of the trench between the two adjacent chips, and the conductive electrodes on the two adjacent chips were arranged asymmetrically, areas between the patterns of the conductive trace layers on the two adjacent chips would be exposed by the lights reflected from the conductive layer. Thus, in such a case, following a development process, a portion of the photoresist layer would be left between the patterns of the conductive trace layers, which would cause shorting between the conductive trace layers after the etching process. However, in the electronic device package of the embodiments of the invention, the semiconductor substrate with a height substantially equal to a depth of the trench is disposed between the two adjacent chips. Thus, in the steps of patterning the conductive layer by the photolithography and etching process mentioned above, the exposures for the patterns of the conductive trace layers on any two adjacent chips would not interfere with each other. Further, shorting between the conductive trace layers would not be produced. In the embodiment of the invention, the conductive trace layers for connecting the contact holes on the different conductive electrodes in the same trench are electrically isolated from each other, wherein the conductive electrode usually includes a conductive pad or a redistribution layer.

Next, referring to FIG. 3F, a cross section of the electronic device package 100 formed by dicing the wafer scale package of the above mentioned electronic devices along the scribe line SC is shown. After the above mentioned conductive trace layer 308a and 308b are completed, a passivation layer 318 is formed on each conductive trace layer 308a and 308b, covering the back surface S2 of the wafer 200 and filling each trench 302a and 302b. The passivation layer may be a solder mask. Then, a conductive bump 322 is formed through the passivation layer 318 to electrically connect to the conductive trace layer 308a. In an embodiment, after forming the passivation layer 318, an opening to expose a portion of the conductive trace layer 308a can be formed by patterning the passivation layer 318. Next, a solder is filled into the above mentioned opening by a electroplating or a screen printing method. A re-flow process is performed to form the conductive bump 322 such as a solder ball or a solder paste. Then, the above mentioned wafer is diced along the scribe line SC to separate each chip and the electronic device package of the invention is completed.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device package, comprising:
   a wafer, containing a chip, wherein the chip has a first surface and an opposite second surface;
   a plurality of conductive electrodes disposed on or over the first surface of the chip a plurality of contact holes formed in the chip to expose the conductive electrodes;
   at least one recess disposed in the chip and apart from the side of the chip by a distance, wherein the at least one recess extends along a direction from the second surface to the first surface of the chip;
   the plurality of contact holes disposed at a bottom of the at least one recess to expose contact surfaces of corresponding conductive electrodes, wherein the plurality of contact holes are disposed at the bottom of a single recess;
   an insulating layer, covering the second surface of the chip and extending to a sidewall and the bottom of the at least one recess, wherein the contact holes are disposed in the insulating layer; and
   a plurality of conductive trace layers disposed on the insulating layer, wherein each of the conductive trace layers extend from the second surface to the sidewall and the bottom of the at least one recess and extend to the contact surface of the conductive electrode through the corresponding contact hole, and width of the conductive trace layers is smaller than a width of the corresponding conductive electrodes as measured in the same direction.

2. The electronic device package as claimed in claim 1, wherein the conductive electrodes comprise a conductive pad or a redistribution layer.

3. The electronic device package as claimed in claim 1, wherein the conductive trace layers extend beyond the at least one recess but terminate between the at least one recess and an adjacent edge of the wafer.

4. The electronic device package as claimed in claim 3, wherein the wafer has a height, and the height of the wafer is substantially equal to a depth of the at least one recess.

5. The electronic device package as claimed in claim 1, further comprising a passivation layer disposed in the at least one recess and extending to the second surface of the chip.

6. The electronic device package as claimed in claim 5, further comprising a package layer covering the first surface the chip.

7. The electronic device package as claimed in claim 1, wherein the chip has a plurality of recesses therein, and the wafer having a height is disposed between the recesses to contain an integrated circuit, a sensor film or a cavity structure.

8. The electronic device package as claimed in claim 7, wherein the height of the wafer between the recesses is substantially equal to a depth of the recesses.

9. A method for fabricating an electronic device package, comprising:
   providing a wafer, wherein the wafer has a first surface and an opposite second surface, wherein the wafer includes a plurality of chips at the first surface;
   providing a plurality of conductive pads on the first surface, wherein a first set of conductive pads are associated with a first chip, and a second set of conductive pads are associated with an adjacent second chip, wherein the first set is spaced apart from the second set about a dice line between the adjacent first and second chips and the first and second sets of conductive pads are arranged asymmetrically about the dice line; and
   exposing the contact pads through the wafer from the direction of the second surface.

10. The method as claimed in claim 9, further comprising:
    forming at least a first recess at the second surface of the wafer, wherein the first recess extends below at least some of the conductive pads in one of the first set of conductive pads and the second set of conductive pads and exposes contact surfaces of the at least some of the conductive pads;
    forming an insulating layer, covering the second surfaces of the substrate and extending to sidewalls and bottoms of the first recess; and
    forming in the insulating layer a plurality of contact holes, wherein at least a first set of the contact holes are located at the bottom of the first recess to expose contact surfaces of the corresponding conductive pads.

11. The method as claimed in claim 10, further comprising forming a plurality of conductive trace layers on the insulating layer, wherein each of the conductive trace layers extends from the second surface to the sidewall to the contact surface of the conductive pad through the corresponding contact hole at the bottom of the first recess, and wherein the conductive trace layers on the adjacent first and second chips are arranged asymmetrically along the direction between the adjacent first and second chips.

12. The method as claimed in claim 11, wherein the wafer has a section between the adjacent first and second chips, and wherein the conductive trace layers on the adjacent first and second chips are isolated by the section of wafer.

13. The method as claimed in claim 11, wherein the step of forming the conductive trace layers comprises:
    conformally forming a conductive layer, to cover the second surfaces of the wafer and extend to the sidewalls and the bottom of the first recess; and
    forming the conductive trace layers from the conductive layer.

14. The method as claimed in claim 13, wherein in the step of forming the conductive trace layers, the conductive trace layers on the adjacent first and second chips are exposed with separate patterns.

15. The method as claimed in claim 10, further comprising:
    forming a package layer overlying the first surface of the wafer including the chips;
    forming a passivation layer overlying the second surface of the wafer and the first recess; and
    dicing the wafer along the dice line to form a plurality of electronic device packages each including a chip.

16. The method as claimed in claim 10, wherein the insulating layer comprises a photosensitive insulating material layer, and the step of forming in the insulating layer the plurality of the contact holes comprises an exposure and a development process.

17. The method as claimed in claim 12, wherein the section of wafer between the adjacent first and second chips has a height coplanar with the second surface.

18. The method as claimed in claim 10, wherein the first recess is located at a distance from an edge of at least one of the adjacent first and second chips.

19. The method as claimed in claim 9, further comprising disposing a transparent substrate overlying the first surface of the wafer including the chips.

20. The method as claimed in claim 11, wherein a width of one of the conductive trace layers is smaller than a width of the corresponding conductive pads.

21. The method as claimed in claim 10, further comprising forming at least a second recess at the second surface of the wafer, wherein the second recess extends below at least some of the conductive pads in one of the first set of conductive pads and the second set of conductive pads which are not above the first recess, and exposes contact surfaces of the at least some of the conducive pads which are not above the first recess, and wherein the second recess does not connect with the first recess.

22. The method as claimed in claim 21, wherein the insulating layer covers the second surface of the wafer and extending to sidewalls and bottoms of the second recess, and the step of forming in the insulating layer the plurality of contact holes includes forming in the insulating layer a second set of contact holes at the bottom of the second recess to expose contact surfaces of the corresponding conductive pads.

23. The method as claimed in claim 21, wherein the first and second recesses are below conductive pads of same one of the first set of conductive pads associated with the first chip and the second set of conductive pads associated with the second chip.

24. The method as claimed in claim 21, wherein the first recess is below the first set of conductive pads associated with the first chip and the second recess is below the second set of conductive pads associated with the second chip.

25. The method as claimed in claim 24, wherein the first recess and the second recess are separated by a section of the wafer between the adjacent first and second chips.

26. The method as claimed in claim 9, wherein the chips are formed at the first surface of the wafer.

27. The method as claimed in claim 9, wherein the chips are deposited onto the first surface of the wafer.

28. An electronic device package, comprising:
a wafer, wherein the wafer has a first surface and an opposite second surface, wherein the wafer includes a plurality of chips at the first surface;
a plurality of conductive pads on the first surface, wherein a first set of conductive pads are associated with a first chip, and a second set of conductive pads are associated with an adjacent second chip, wherein the first set is spaced apart from the second set about a dice line between the adjacent first and second chips and the first and second sets of conductive pads are arranged asymmetrically about the dice line; and
a plurality of openings exposing the contact pads through the wafer from the direction of the second surface.

* * * * *